United States Patent [19]

Lampkin et al.

[11] 4,239,809
[45] Dec. 16, 1980

[54] METHOD FOR QUALITY FILM FORMATION

[75] Inventors: Curtis M. Lampkin; Guy A. Roderick; Robert B. Nikodem, all of El Paso, Tex.

[73] Assignee: Photon Power, Inc., El Paso, Tex.

[21] Appl. No.: 886,891

[22] Filed: Mar. 15, 1978

[51] Int. Cl.² ............................................. B05D 5/12
[52] U.S. Cl. ..................................... 427/74; 136/260; 427/110; 427/421; 427/427
[58] Field of Search ............... 427/74, 110, 427, 421; 136/89 CD

[56] References Cited

U.S. PATENT DOCUMENTS

| | | | |
|---|---|---|---|
| 3,148,084 | 9/1974 | Hill et al. | 427/74 |
| 3,223,549 | 12/1965 | Fredley et al. | 427/110 |
| 3,586,541 | 6/1971 | Chamberlin | 427/74 |
| 3,652,246 | 3/1972 | Michelotti et al. | 65/60 |
| 3,660,061 | 5/1972 | Donley et al. | 65/60 |
| 3,689,304 | 9/1972 | Bamford | 65/60 |
| 3,880,633 | 4/1975 | Jordan et al. | 65/60 |
| 3,887,349 | 6/1975 | Akashi et al. | 65/60 |
| 3,959,565 | 5/1976 | Jordan et al. | 428/432 |
| 4,123,244 | 10/1978 | Leclerz | 118/326 |
| 4,125,391 | 11/1978 | Van Laethen | 427/110 |

Primary Examiner—Shrive P. Beck
Attorney, Agent, or Firm—Bard & Groves

[57] ABSTRACT

Methods and apparatus are provided for forming films of materials which are component layers of solar energy conversion devices, e. g. photovoltaic cells and heat collector panels. A selected substrate is heated while being sprayed with solutions which react on the heated surface to form a particular film. Films of $SnO_x$ and CdS are particularly produced. According to the present invention, the spray is projected at an angle to control upstream flow and confine film formation to the substrate panel portions most suitable for forming the selected film. Various waste products are removed to minimize defects in the resulting film. Baffles are located to shield the substrate surface at selected areas and preclude the spray from impacting on the shielded areas.

11 Claims, 6 Drawing Figures

METHOD FOR QUALITY FILM FORMATION

BACKGROUND OF THE INVENTION

1. Field of the Invention

The present invention is directed to method and apparatus for the production of solar energy conversion devices, and, more particularly, to methods and apparatus for forming high quality material films on a glass substrate for improved solar heat collection panels and for large area photovoltaic panels.

A clear need has arisen for alternate sources of energy in the United States and throughout the world as traditional energy sources are being depleted. Solar energy is one of the alternate sources being examined because of its availability and apparent lack of polluting side effects. The conversion of solar energy into an energy form which is domestically usable generally takes two forms. A first form is heat energy, wherein incident solar radiation is transmitted through a suitable transparent panel to heat a material, generally a liquid contained therein, and where the infrared radiation emitted by the heated material is reflected by the covering panel and thereby retained within the heat generating unit. A second form is electricity, wherein the incident solar radiaton is directly converted at a photovoltaic junction into a direct current supply which may be interconnected with external equipment to provide either a direct current or alternating current power supply for conventional use.

It is estimated that solar energy arrives on the surface of the United States at an average rate of 41000 cal/m$^2$-day. Over a period of a year, a square kilometer would receive an average of $1.5 \times 10^{12}$ cal. For 1977, the total estimated energy consumption by the United States for all purposes will be about $20 \times 10^{15}$ kcal. Thus, about 13,000 square kilometers of continental United States land receives in one year, on the average, the equivalent of all the United States energy needs. At a 5% conversion efficiency, which is obtainable from current generation solar cells, about 267,000 square kilometers or about 5% of the land area of the 48 contiquous states could provide the equivalent of the estimated 1977 United States energy consumption.

It is clear from the above discussion that enormous land areas must be covered by solar conversion equipment in order to have any appreciable impact on the energy needs of the United States. Current research programs are concentrating on obtaining more efficient solar energy converters to provide the required large area coverage. It is axiomatic that all the research programs are concentrating on ways to provide these solar energy converters at costs which are competitive with current energy sources.

In one approach to mass producing solar energy devices, a transparent vitreous substrate, such as glass, has been utilized as the surface upon which the solar radiation is incident. A glass substrate provides not only a suitable supporting structure, but also provides a surface which is particularly suitable for the formation of films, yielding improved solar conversion efficiencies. A particularly suitable film for various solar energy conversion devices is a form of tin oxide produced according to the present invention, which is highly transparent to incident solar radiation, highly reflective to incident infrared radiation, and yet obtains a high sheet conductivity for transmitting electrical current. Prior techniques for forming suitable films of tin oxide are disclosed in U.S. Pat. Nos. 3,880,663 and 3,959,565, both by Jordan and Lampkin. The tin oxide coated glass produced in accordance with the present invention and the subject patents can be used in a device converting solar energy to heat or as a transparent electrically conductive substrate in a device converting solar energy to electricity.

If it is desired to construct a device for converting solar energy directly to electricity, photovoltaic films must be deposited on the tin oxide. In one configuration, a polycrystalline layer of cadmium sulfide (CdS) is formed on the tin oxide layer and a layer of cuprous sulfide is formed at the surface of the cadmium sulfide to provide a photovoltaic junction at the junction between the cadmium sulfide and the cuprous sulfide.

2. Description of the Prior Art

It is taught in U.S. Pat. Nos. 3,880,633 and 3,902,920 and U.S. patent application Ser. No. 767,684 filed Feb. 11, 1977, all by Jordan and Lampkin, that high quality tin oxide and cadmium sulfide films are produced when suitable film-forming compositions are sprayed on a glass substrate, where the substrate is continuously heated during the sprayiing operation and where the spraying operation is performed in such a manner that the surface of the glass substrate being sprayed is maintained at a substantially constant temperature and substantially free of temperature gradients. These patents and patent applications teach heating the glass substrate by floating the substrate on a molten liquid, such as tin or a molten salt, at a temperature selected to optimize the formation of the desired film. It is taught that a molten liquid provides intimate contact between the glass substrate and the heat source to insure a substantially uniform temperature along the surface of the glass substrate. It is further taught that the use of a solid heating surface, such as a hot plate, results in uneven contact and, therefore, uneven heat transfer into the glass substrate whereby substantial temperature gradients are obtained along the surface.

Prior to the patents and patent application to Jordan and Lampkin, hereinabove discussed, the prior art which relates to the production of solar cells on a glass substrate was directed to the production of only small area photovoltaic cells which could be formed by directing a spray of the selected film-forming composition over the entire surface. For example, U.S. Pat. No. 2,522,531 to Mochel teaches formng a layer of tin oxide on a glass substrate while the glass is floating on a molten metal. Mochel teaches spraying a stationary glass substrate, and the spray covers the entire substrate surface at any instant of time. U.S. Pat. No. 3,148,084 to Hill et al teaches forming a cadmium sulfide film by spraying a film-forming composition onto a glass substrate which is being heated on a hot plate during the spraying. The Hill reference also teaches spraying the entire substrate while the film is being formed.

It is important to note at this point that neither the Mochel nor the Hill patents contain any teachings relative to the importance of maintaining the sprayed surface of the glass substrate at substantially a constant temperature and substantially free of temperature gradients while the spraying is being conducted. Indeed, such a consideration is of little importance in fabricating a small area photovoltaic device in which the entire surface is being sprayed at one time. The Jordan et al references teach that such temperature gradients are of particular importance in forming large area photovoltaic panels where only a portion of the glass substrate is sprayed at any one time where such spraying can introduce detrimental temperature gradients. In the Jordan and Lampkin patents and patent application, hereinabove referenced, the temperature gradients are controlled by the spraying technique and by floating the glass substrate on a molten material to resupply heat losses.

The Jordan et al references specifically teach that a uniform surface temperature is desired during the spraying operations to produce the film qualities required to form acceptable photovoltaic cells. However, use of the molten liquid heat source presents obvious equipment design difficulties, particularly in providing for an event where solidification of the heated liquid occurs. In addition, convection of the heated liquid tends to maintain the liquid at a relatively uniform average temperature and does not readily permit localized heating of the glass substrate to particularly resupply the heat which is lost in the spraying operation. A further difficulty with using a molten liquid is that conduction transmits substantial energy to the surroundings and imposes a corresponding requirement to supply energy to the molten liquid.

Yet another important factor in forming the quality films for solar energy conversion devices is the spray application itself. Defective films may be formed where the spray is incident on a unheated area of substrate or where spray debris falls to the surface or volatilized residue redeposits. These effects are particularly pronounced during formation of the $SnO_x$ layer. Since the $SnO_x$ is the base for the entire cell, an entire panel can be ruined at the first spray booth. However, these same effects occur during CdS layer formation and can act to reduce overall cell efficiency.

The disadvantages of the prior art are overcome by the present invention, however, and improved methods and apparatus are provided for forming large photovoltaic panels where such panels may be produced on a continuous basis into photovoltaic cells and where high quality films are formed over the surface of the glass substrate with superior characteristics, particularly suitable for solar energy conversion devices, and at low costs.

SUMMARY OF THE INVENTION

A spray method and apparatus are provided to obtain a high capture rate for sprayed solution incident on the heated substrate, while selectively directing the sprayed solution toward only a portion of the substrate surface exposed to a selected heat zone. Atmospheric movement about the spray and the exposed surface acts to remove volatilized solution residue from above the substrate surface. Thus, film formation is generally obtained from the projected solution which is directly incident on only that portion of the substrate surface which has been found to produce films of the required quality.

One embodiment of the spray method and apparatus employs a spray nozzle projecting solution at an angle selected to control any upstream scatter of the drops upon impact with the surface. Baffles are provided to selectively expose the substrate surface generally above the controlled heat zone to obtain film formation under controlled conditions. The baffles further cooperate with the atmospheric movement to minimize any redeposition of reaction products onto the substrate.

An improved tin oxide film is produced through controlled solution deposition and heating during film formation. The tin oxide film has a reflectivity of greater than 82%. to infrared radiation of wavelength 3-15 microns; an emissivity of less than 0.1 for wavelengths greater than about 5 microns at temperatures below about 350°; and a sheet resistivity of 4-15 (average 10) ohms/sq. at thickness range of 0.25-1.0 (average 0.4) microns. Further, the tin oxide film thus formed is chemically inert, stable at high temperature and under ultraviolet irradiation, and forms a hard, tightly adherent film on the glass substrate. These characteristics are uniquely suitable for a coating used in solar-to-electrical energy conversion devices.

Accordingly, it is a feature of the present invention to provide for the mass production of large area photovoltaic cells by a process during which a substrate is continuously heated.

It is a feature of the present invention to provide improved films of materials for solar energy conversion devices for more efficient use of incident solar radiation.

Yet another feature of the present invention is to control deposition of the projected solution to an area in functional proximity to a controlled heat zone.

One other feature of the present invention is to provide a rate of spray functionally related to the desired film thickness to be formed and to the ability of the controlled heat zone to replace heat losses during the spraying whereby the exposed surface temperature is maintained within a predetermined range during film formation.

Still another feature of the present invention is to project the sprayed solution at an angle effective to control upstream flow of the incident solution.

These and other features and advantages of the present invention will become apparent from the following detailed description wherein reference is made to the figures in the accompanying drawings.

IN THE DRAWINGS

FIG. 1. is an isometric view of a typical spray station in a production line for solar energy conversion devices.

DETAILED DESCRIPTION OF THE PREFERRED EMBODIMENT

Figure 1:
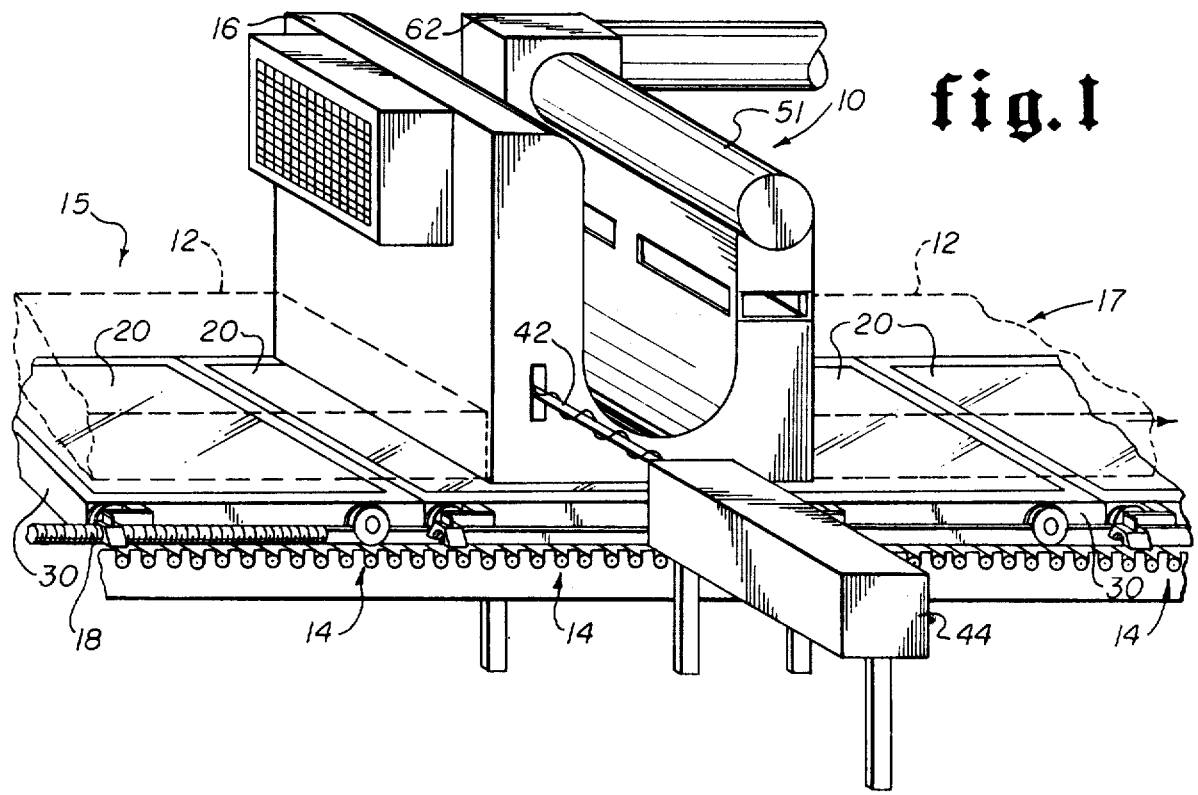

Referring now to FIG. 1, there may be seen an isometric pictorial of a typical spray station which is used in forming films on a production basis for portions of solar energy conversion devices. The basic spray process includes a spray head which produces a divergent spray of small droplets and which may be actuated whereby any given portion of the substrate receives the spray for only a short period of time. The required film thickness may be formed by intermittently spraying each area until that film thickness is obtained. The spray process is designed to reduce the heat removed from any portion of the substrate in a preselected time interval.

Although the above spray apparatus is presently a preferred embodiment, other arrangements may include electrostatic spray systems and/or a plurality of stationary sprays continuously or intermittently actuated. The present method and apparatus contemplate any acceptable spray device capable of delivering a controlled spray.

It is known that the production of a large area photovoltaic cell or solar heat collector requires that the films which comprise the cell or collector surface be formed uniformly over the entire substrate area which defines the energy converter. It is also known that uniformity of film formation is directly related to maintaining a consistent surface temperature during film formation. Accordingly, heat must be supplied to the surface as heat is removed by air flowing over the glass surface, by vaporization of the various solvents which carry the film-forming materials, and by the chemical reactions in which the specific films are formed. Because of the low thermal conductivity of glass, a large capacity heat source must be used which is capable of a heat input to the glass substrate at a rate and in an amount approximating the heat removed from the substrate.

Accordingly, as shown in FIG. 1, spray station 10 is provided where screw conveyor 18 moves carriages 30 through enclosure 12, carrying glass substrates 20 into a spray area. Screw conveyor 18 is needed only in a first preheater section 15 to drive the carriage 30. All of the carriages are shown in abutting relationship whereby downstream carriages 30 are pushed along by new entering carriages. This arrangement minimizes problems with thermal expansion and carriage misalignments along the carriage route.

Spray booth 16 encloses at least one spray head, which may traverse across substrate 20, and provides for the removal of residual products from the sprayed surface. Radiative heaters may be spaced along enclosure 12 and beneath glass substrate 20. Temperature detectors 22 (see FIGS. 2 and 3) are provided for monitoring the temperature of the glass substrate as substrate 20 moves over the radiative heaters 14. Typically, radiative heaters 14 may also be provided in a preheater section 15 to heat glass substrate 20 and maintain a preselected temperature as substrate 20 enters spray booth 16. A post-spray heating section 17 may also be provided for post-heat treatment of the sprayed composition and/or heat treatment of the glass substrate. The heated sections are generally contained in insulated enclosures 12 for substrate temperature maintenance.

Figure 2:
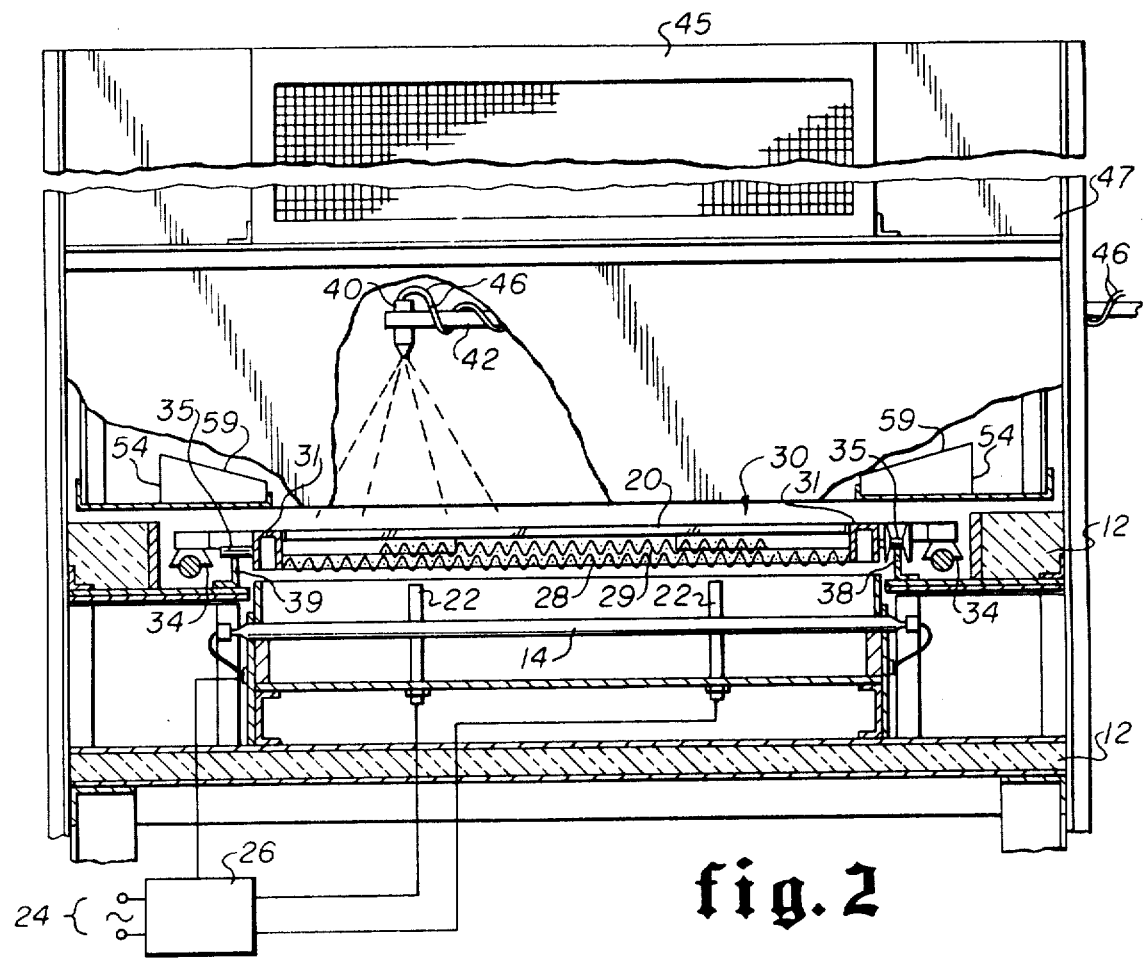
FIG. 2 is a cross-sectional front view of the spray station illustrated in FIG. 1.

Referring now to FIG. 2, there is shown a cross-sectional front view of a spray booth, according to one embodiment of the present invention. Glass substrate 20 is supported on supports 32 (See FIG. 5) which are, in turn, supported by carriage frame 30. Frame 30 is mounted on tracks 38 for moving through the enclosures 12, and may conveniently have attached wheels 35 and 36 for engaging tracks 38. Spray nozzle 40 may be mounted on lateral traversing track 42 for moving above glass substrate 20 and may conveniently be driven by a traversing drive means 44 (see FIG. 1). Material supply lines 46 feed the film-forming compositions and pressurized gas, if needed, to spray nozzle 40 for atomization and application to glass substrate 20. Spray nozzle 40 and supply lines 46 may be insulated and/or air or water cooled to prevent any prespray vaporization of the solution which might result in fouling of the spray gun. Spray nozzle 40 may traverse above substrate 20 in a sequence programmed to uniformly distribute the film-forming composition over the surface of glass substrate 20.

Typically, where a traversing spray is provided, nozzle 40 moves at a generally uniform rate when above substrate 20 and then reverses travel when over a side portion of spray booth 16 away from substrate 20. Thus, each portion of the substrate 20 is contacted by the same quantity of sprayed composition. It has been found that the spray during the reversing cycle can produce fumes and spattered materials which, if allowed to redeposit, can degrade the quality of the films formed on the substrate. Accordingly, it is desirable to include dwell tubes 54 which receive material from spray nozzle 40 during the reversing, or dwell cycle. Dwell tubes 54 open to the exhaust portion 48 of spray booth 16 so that air flow acts to exhaust the unused spray and prevent fumes and spatter from returning to the substrate.

Located beneath substrate 20 are radiative heaters 14. It is generally desired that radiative heater 14 have a length greater than the width of substrate 20 in order to minimize gradients in the radiative energy distribution above radiative heater 14 and beneath substrate 20 and, particularly, near the edges of substrate 20. A length-to-width ratio of about 1.4:1 appears to provide acceptable results. Radiant heaters 14 are electrically connected in groups selected to match controlled heat input zones with heat removal zones.

Temperature detectors 22 may be located beneath substrate 20 in a relationship to detect the surface temperature of substrate 20. Although two temperature detectors 22 are shown, only one may be employed or more than two may be employed depending on the detecting ability required to control the radiative energy distribution by selectively energizing radiative heaters 14. The outputs from temperature detectors 22 may be provided to a control device 26, which may conveniently average the detected temperatures and selectively energize radiative heaters 14 from power source 24 to maintain a predetermined substrate surface temperature.

Alternate temperature detectors 22 may be provided for obtaining an electrical signal functionally related to the temperature of substrate 20. Optical pyrometers providing a digital output are available, although the spray environment is somewhat detrimental. The temperature detectors 22 might also be located above substrate 20 if the detectors are properly calibrated.

A fan 62 (see FIG. 1) may be provided for moving the atmosphere within spray booth 16, as hereinbelow described. If air is to be introduced, an input section 45 may include accessory equipment such as filters, adjustable louvers, and electrostatic precipitators. It is also possible to include control circuitry for the fan 62 (FIG. 1) using supply and exhaust pressure detectors, whereby a constant gas flow is maintained. The fan 62 (FIG. 1) is conveniently mounted on exhaust duct 51 and may be any conventional fan.

Figure 3:
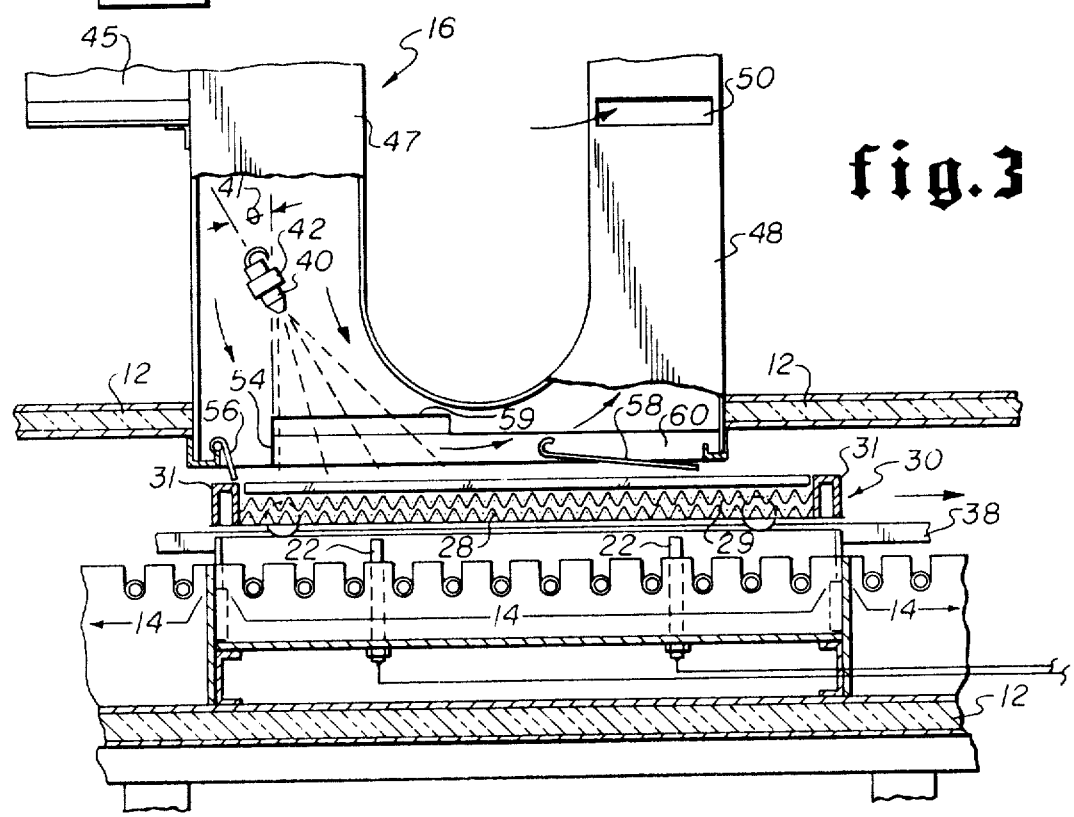
FIG. 3 is a side cross-sectional view of the spray station illustrated in FIG. 1.

Referring now to FIG. 3, there is shown a cross-sectional side view of spray station 10. Again, glass substrate 20 is beneath spray nozzle 40 which is being driven by traverse drive means 44 (FIG. 1). After the chemicals contained in the spray compositions have reacted to form the selected film on the surface of substrate 20, the volatilized residue from the spray is removed from above substrate 20 to prevent the deposition of this material on the surface and possible reduction in quality of the film being formed.

It has been noted hereinabove that substrate surface temperature maintenance is necessary for quality film formation. The flow of air through spray booth 16 imposes one of the largest heat loads on the system and careful regulation of the air flow is required for controlled conditions. First, the inlet gas flow may be minimized by using the exhaust system 48 to augment the inlet gas for vapor dilution and exhaust temperature control. In one convenient form, slots 50 are provided in the exhaust 48. The total area of slots 50 can be varied to adjust to a variety of operating parameters. Second, instrumentation (not shown) may be provided to maintain a "standard" condition within spray booth 16. At any given fan speed, slots 50 can be adjusted to provide the desired internal pressure conditions as related to the instrumentation readings.

The need for air flow through spray booth 16 is a function of several parameters: volatility of solvents for the sprayed compounds, removal of waste products from the substrate surface, and control of exhaust temperature. Thus, the use of a methanol solvent requires a large gas volume to maintain a non-explosive mixture, while a water solvent imposes no dilution requirement. However, it appears that some atmospheric movement within spray booth 16 is generally desirable to remove waste products which might otherwise re-deposit on the substrate 20.

Yet another factor in forming high quality films is control of the compounds which reach the substrate 20 surface and deposit thereon. A first control is to limit deposition of the sprayed composition to a region found to yield the desired film quality, a region generally above the controlled heaters 14 beneath the spray cone from spray nozzle 40. Pre-spray and post-spray deposition, i. e. deposition not directly beneath the spray cone, is controlled as required by particular film components. The film is formed generally from compounds in the solution directly impinging on the substrate surface and waste products are not allowed to deposit.

Only a portion of the substrate surface is exposed to the sprayed solution so that most of the deposition of the solution occurs over the spray zone heaters, hereinafter discussed. First, a pre-spray baffle 56 may be provided at the entrance to spray booth 16. Baffle 56 is hinged to accommodate the passage of carriages 30 from heated enclosure 12 to spray booth 16. Baffle 56 may conveniently rest on frame 31 during carriage 30 passage in non-touching proximity to substrate 20.

Next, spray nozzle 40 may be tilted with respect to the vertical to point downstream relative to substrate 20 movement. Angle 41($\theta$) is selected to control the flow of incident spray upstream. The angle at which upstream flow is reduced to near zero must be determined for any given spray nozzle 40. Theoretically, the need to control upstream flow is determined by the nature of the particular film which is being formed. Thus, $\theta 41$ must be determined for each film and some variation about 30° should generally be found to be satisfactory. Increasing $\theta$ has the effect of reducing spray capture efficiency, as hereinbefore explained, and the minimum effective $\theta$ is preferred.

Post-spray deposition may also be substantially reduced by a combination of baffling and air flow. A second baffle 58 is provided downstream of nozzle 40 and generally arranged in proximity to an outer portion of the spray cone from nozzle 40. Baffle 58 is placed above substrate 20 and may be provided with a leading edge designed to deflect air flow above baffle 58. Incoming gas or air then entrains any vapor and other reaction products above substrate 20 and carries these waste products over baffle 58 and into exhaust system 48. It is also possible that the air flow, in combination with the tilted nozzle, might tend to increase the uniformity of the size of spray droplets impinging on substrate 20 since the trajectory of the smaller droplets would cause them to be swept further downstream before impinging on substrate 20 and the location of baffle 58 may effectively prevent the smaller drops from reaching substrate 20.

Finally, baffling may be provided to prevent spray which occurs during the reversal dwell time of spray nozzle 40 from spattering back onto substrate 20. Dwell tubes 54 are provided for the region beneath nozzle 40 during the travel reversal of nozzle 40. Dwell tubes 54 may be provided with an opening 59 sized to intercept the spray cone from nozzle 40. During the reversal of nozzle 40, the spray enters opening 59 along with some portion of the air flow, and is swept through duct 60 to the exhaust region 48. The spray projected during the reversal is then removed from the spray booth 16 without contacting substrate 20.

Another heat load which must be considered for substrate temperature maintenance is caused by the incident spray. Heat is required to vaporize the solvent and to drive the chemical reaction which occurs on the heated substrate 20. The spray heat load is transient and the heat input is not sufficiently rapid to resupply this load whereby no temperature drop occurs on the sprayed surface. Accordingly, it is desirable to minimize the volume of material which must be sprayed adjacent substrate 20 and, therefore, the resulting temperature variations.

The selected spray rate is functionally related to the ability of the controlled heat zone to resupply heat losses. Control of the rate of spray impinging on the surface may conveniently be maintained as a function of the volumetric rate of flow and the "dwell" time or duration of spray on a given area of substrate surface. It should be noted that reducing the volumetric rate of spray also reduces the amount of gas or air which must be introduced and, therefore, further results in a reduced heat load.

It is fundamental that if the volume of sprayed material is reduced, and if the film thickness is to be maintained, the spray capture efficiency must be increased unless production speed is decreased or additional spray stations installed. One convenient way to increase spray capture efficiency is to decrease the elevation of nozzle 40 above substrate 20. Thus, an optimum elevation may be readily determined for a given set of operating parameters.

There are a variety of radiative heaters 14 which might be used in practicing the subject invention. A quartz-type heater may be employed, wherein the heating element is directly exposed to the glass substrate for maximum efficiency in heat transfer. Alternatively, heater wells may be provided within enclosure 12 and heater elements inserted within the wells. The heater well arrangement allows a heater to be replaced with minimum interference with production line operations, but the intervening well wall results in some loss of energy transfer. The method for energizing the radiative heater elements may influence the choice of the particular heater element. In this respect, intermittent energizing of the heater element may require that the heater element have a specified heat capacity in order to damp the energy output transients which will result during energizing cycles of the heater. Such a damped response may be necessary to insure the glass is not subject to radiative energy gradients which could introduce temperature gradients to crack the glass. Proportional control such as duty-cycle control reduces thermal energy gradients and could be employed if excessive glass breakage is obtained. Further, radiative heating can also be obtained from combustion apparatus where a flame is used to heat metal elements or fiber-like mats of glass or carbon to temperatures effective for radiative heating.

Temperature detector 22 is shown in FIG. 3 as disposed beneath the track of spray nozzle 40. Temperature detectors 22 may also be located both before and after the spraying operation to control the pre- and post-spray temperature of the glass. In one embodiment, temperature detector 22 may take the form of a thermocouple 52 (see FIG. 4) which is directed toward glass substrate 20. The distance between the thermocouple and the surface of substrate 20 which is being illuminated by radiative heaters 14 introduces an error in the temperature reading from thermocouple 52 which must be corrected by the control equipment. By placing thermocouple within a cylindrical enclosure thermocouple might be made to "see" substantially only the surface of glass substrate 20 and thereby produce an output signal which is highly correlative with the temperature of substrate 20. The arrangement of temperature detector 22 within enclosure 12 and adjacent glass substrate 20 should not introduce additional temperature gradients along the sprayed surface of glass substrate 20. For example, thermocouple 52 spacings can be selected where the bottom surface of substrate 20 is not shadowed from the radiative energy of adjacent radiative heaters 14.

Figure 4:
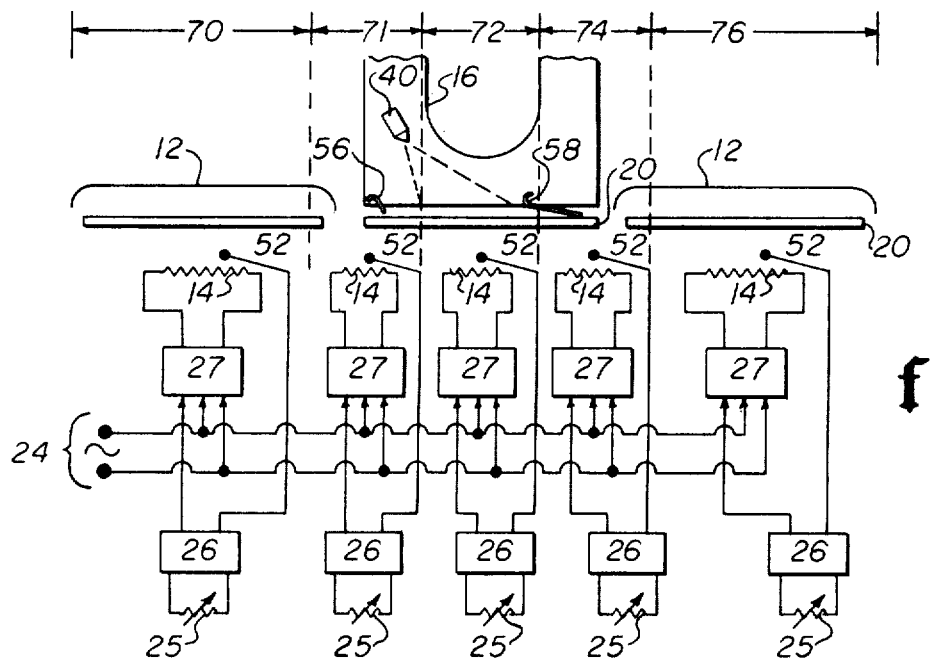
FIG. 4 is a pictorial schematic of a radiative heater control system.

Referring now to FIG. 4, there may be seen a schematic of a heater installation and control arrangement supporting a particular spray booth 16. Four basic heat zones may be provided. A first pre-heat zone 70 uniformly heats substrate 20 to the film-forming temperature selected for the composition being sprayed onto the heated surface. A first heat zone 71 may be provided in spray booth 16 where spray nozzle 40 is directed downstream. Heat zone 71 may be controlled to a temperature to obtain some pre-spray film formation, if acceptable. A second heat zone 72 provides heat input beneath the projected spray to replace heat lost during the spray process. A third heat zone 74 after the spray restores and/or maintains substrate 20 at a temperature selected to complete film formation from the sprayed components. A post-spray heat zone 76 may be provided outside spray booth 16 if heat treatment of the filmed surface is desired, e.g. to promote crystal growth, to anneal substrate 20 and/or to establish substrate 20 at a temperature for a next spray station.

Each of the heat zones shown in FIG. 4 are provided with heaters which may be controlled independent of the heaters in other zones. A typical control arrangement uses a temperature detector, such as a thermocouple 52, a temperature control circuit 26 with an adjustable control point 25, a solid state relay 27, power supply 24 and radiative heaters 14. If desired, a plurality of thermocouples 52 may be provided to obtain an average lateral temperature at a given location for control purposes.

Typically, thermocouple 52 output signal is compared with set point reference 25 which corresponds to a preselected substrate temperature. The temperature control circuit 26 then generates an error signal which actuates solid state relay 27 to energize heaters 14 as needed to maintain the temperature of substrate 20 generally uniform and constant. The error signal may be in the form of an on/off signal or may be a proportional signal for varying the output on a continuing basis. If combustion-type heaters are provided then the error signal may conveniently be applied to a valve actuator (not shown) to control the supply of gas which burns to heat the radiative elements.

In a steady-state operation, it may be possible to have groups of heaters operating continuously at pre-selected power settings which have been determined for the steady-state operating parameters. Then the control system might only be required to make minor adjustments and/or function as an alarm system.

In this manner, the glass substrate temperature may be continuously monitored and controlled as the substrate is conveyed through the various processes necessary to fabricate the entire glass substrate panel into a large area energy conversion device. Further, in some instances, substrate 20 must be passed through a plurality of spray booths in order to form the films to the required thickness. The use of controlled radiative heating permits greater energy inputs to be selectively provided to the sprayed region while radiative heat inputs at intermediate locations are required only to maintain the sprayed surface at selected steady-state temperatures and generally free of temperature gradients.

Figure 5:
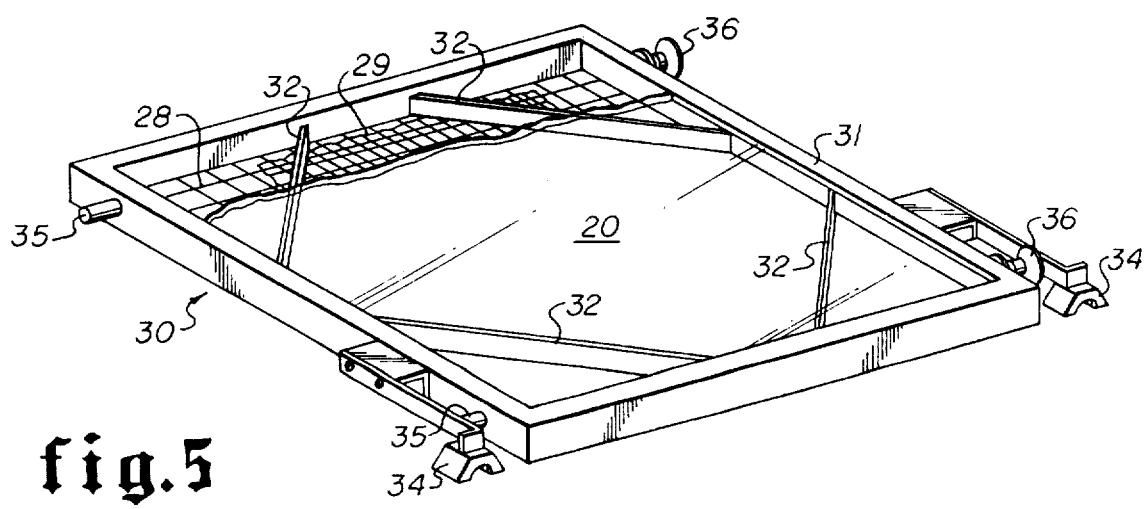
FIG. 5 is an isometric view of a glass panel carriage for movement along the production line.

In FIG. 5, there may be seen a carriage and support assembly 30 for glass substrate 20. A basic frame 31 is provided which may be equipped with mobile supports which may conveniently take the form of wheels 35 and 36, and moves along over the radiative heater enclosures. Drive means 34 are provided to propel carriage 30 along the production line. Substrate 20 rests on substrate support means 32 and a glass capture device 28 may be provided to contain any broken glass.

In one embodiment of carriage 30, the mobile supports are formed from two sets of wheels. A first set of alignment wheels 36 rides on a track 38 (FIG. 2) and maintains alignment of carriage 30. A second set of roller wheels 35 having a generally wide surface is provided to accommodate dimensional changes in tracks 38 and frame 31 as carriage 30 traverses the variety of temperature conditions needed to fabricate the various films suitable for solar energy conversion devices.

Carriage 30 is propelled along the production line by a coupling mechanism 34. It is important to provide a positive displacement-type drive system to insure the uniform velocity of carriage 30 needed to optimize film quality. In one embodiment, a screw-type conveyor is provided at the carriage input section of the production line where a rotating lead screw 18 (FIG. 1) engages coupling mechanism 34 which may conveniently be a split nut attached to frame 31. It is desirable to place split nut 34 at a locaton where frames 31 of adjacent carriages 30 can form a substantially continuous assembly whereby spraying, once begun, can be maintained without interruption. This arrangement may be obtained by extending split nuts 34 laterally from frame 31.

The glass substrate 20 is supported within frame 31 by substrate support means 32. Support means 32 is generally designed for minimum contact with substrate 20 so that unacceptable temperature gradients are not produced in substrate 20. It is also desired that substrate 20 be supported at about the same elevation as the upper elevation of frame 31 to minimize any spray into the radiative heater region. Support means 32 may conveniently be provided by blade-like members extending diagonally across the corners of frame 31. The blade edges provide a constant elevation support while contacting only a minimum surface area of substrate 20 and accomodating lateral thermal expansion. Alternately, wires or pin-like supports may be provided about frame 31 for supporting substrate 20. Support means 32 may be conveniently designed to maintain the elevation of substrate 20 substantially constant over the expected temperature ranges.

A safety mesh 28 may also be provided to catch glass remnants in the event of breakage. The broken pieces will retain a generally intact configuration and prevent spray contamination of the region beneath the glass. Further, a continuity of system response will be maintained. If desired, a second mesh section 29 may be provided as a partial radiative energy shield. The expected thermal energy input to substrate 20 does not generlly obtain a uniform profile, but rather is a maximum at about the midpoint of enclosure 12. Accordingly, mesh 29 serves to block a portion of the radiative energy input to substrate 20 adjacent the middle of substrate 20 and yield a more uniform heat input profile over the illuminated surface of substrate 20.

It will be appreciated that the radiative heaters and spray booth hereinabove discussed can be used in forming any of the films which are produced by a spray process in making a large area photovoltaic cell. It will be further appreciated that these radiative heaters provide one greatly improved means for selectively controlling the energy input to a glass substrate to maintain the sprayed surface substantially free of temperature gradients. It will also be appreciated that the use of radiative heaters greatly simplifies the design of a conveyor system for moving the glass system for moving the glass substrate during the production process.

As an intermediate product in forming a photovoltaic panel, a glass substrate coated with tin oxide is produced. Such a coated glass panel has properties which are useful in the conversion of solar energy into heat energy. In particular, an improved tin oxide film is produced when the tin oxide-forming compositions disclosed in the hereinabove referenced Jordan and Lampkin patents and patent application, which disclosures are incorporated herein by reference, are sprayed onto a heated glass substrate using spray techniques hereinabove disclosed. The resulting film of tin oxide has an improved transmissivity to incident solar radiation over that noted in the referenced patents and has lower specific sheet resistivities and a correspondingly higher reflectivity to infrared radiation than the tin oxide film produced by the same film-forming compositions sprayed onto a glass substrate when heated by a molten liquid. It is also theorized that the radiative heating may result in some direct radiative heating of the film-forming compositions on the sprayed surface in addition to the heat energy supplied from the glass itself. Further, a controlled heat input is provided which is located directly beneath the incident spray.

Operation of the above system to produce quality films for use in solar energy conversion devices will now be described with references to the apparatus of FIGS. 1 through 5 and with specific examples of spray compositions which yield satisfactory results. In addition to the listed examples, additional satisfactory compositions for forming films of tin oxide are given in U.S. Pat. Nos. 3,092,920, issued Sept. 2, 1975; 3,880,633, issued Apr. 29, 1975; and 3,959,565, issued May 25, 1976, which disclosures are incorporated herein by reference. Additional satisfactory compositions for forming films of cadmium sulfide are given in U.S. Pat. No. 3,902,920, issued Apr. 29, 1975, and in U.S. Pat. Application Ser. No. 670,625, filed Mar. 26, 1976 now U.S. Pat. No. 4,095,006.

In forming a tin oxide film, a glass substrate 20 is first preheated to a uniform surface temperature in the range of 460°–500° C. by radiative heaters 14. Carriage 30 conveys substrate 20 beneath pre-spray baffle 56 and under the cone of spray projected from nozzle 40. Any temperature drop of the emerging substrate is detected by thermocouple 52 and the spray zone 72 heaters 14 are energized to maintain the substrate average surface temperature in the range of 440°–480° C. during the spray. A temperature variation of no more than about ±10° C. is desirable to maintain optimum film clarity and conductivity.

A solution containing a tin salt in an organic solvent is prepared for spray deposition over the surface. A fluorine-containing compound is preferably added as a dopant to obtain the very low sheet resistivities which are desired. Generally, a small amount of hydrochloric acid is added to the solution, and may act to reduce any oxidized tin in the solution to maintain the solution for a longer period. The following solution example produces tin oxide films having sheet resistance, as hereinbelow described:

| 700 ml | $CH_3OH$ (Methanol) |
|---|---|
| 2–10 ml | HCl (concentrated) |
| 4 gms | $NH_4HF_2$ |
| 119 gms | $SnCl_2 \cdot 2H_2O$ |

Anhydrous $SnCl_2$ may also be used, if desired. The solution should, however, be prepared from a solution of $SnCl_2$ which has not oxidized and which remains clear when mixed with methanol.

The sprayed solution is preferrably deposited over the single spray heat zone 72 in order to improve film adherence to the substrate. The spray angle $\theta$ is chosen to be about 30° so that back flow is substantially minimized or eliminated. It has been found that the tin oxide film is formed generally over heat zone 72, but that some portion of the film is formed over heat zone 74 beneath baffle 58. Some portion of the sprayed solution may become trapped beneath baffle 58 and form a tin oxide film, but the exact formation mechanism is not known. However, this film portion is of superior quality and a slight incline may be given to baffle 58 to promote the underlying film formation.

The following spray booth parameters shown in Table I have been used with the above solution to form a tin oxide film over a substrate having a surface area of about four square feet:

TABLE I

| Spray Elevation | $\Theta$ | Spray Volume | Substrate Speed | Spray Speed |
|---|---|---|---|---|
| 17" | 0° | 200 + ml | 1.0 in/min | 15–20 in/sec |
| 10" | 33° | 180 ml | 1.8 in/min | 15–20 in/sec |
| 10" | 33° | 80 ml | 1.8 in/min | 15–20 in/sec |
| Spray Zone | | Booth Air | Film | Sheet |

TABLE I-continued

| Power | Flow | Thickness | Resistivity |
|---|---|---|---|
| 22 kw | 200-300 ft3/min | 0.3-0.6μ | 10-15 Ω/sq |
| 11 kw | 200-300 ft3/min | 0.3-0.6μ | 7-10 Ω/sq |
| 11 kw | 200-300 ft3/min | 0.3-0.6μ | 15Ω/sq |

The effects of spray elevation and nozzle tilt on the required solution volume to be sprayed, substrate speed, power requirements and the resulting sheet resistivity are demonstrated by the results shown in Table I.

Figure 6:
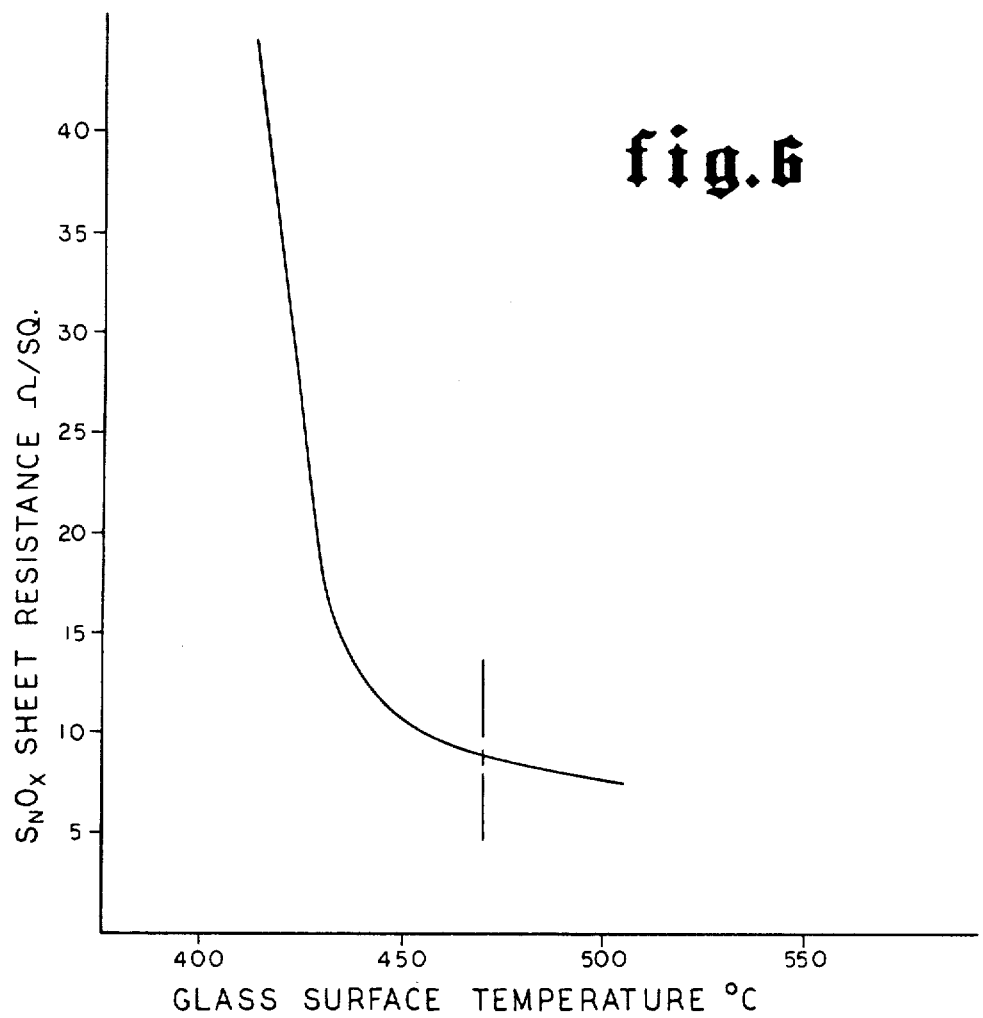
FIG. 6 is a graph of sheet resistance v. film formation temperature.

Referring now to FIG. 6, there may be seen a graph of tin oxide sheet resistivity vs. substrate temperature where the tin oxide film is formed according to the above teachings. The optimum tin oxide film for solar energy conversion is obtained at the minimum sheet resistivity. The reflectivity of the tin oxide film is incident infrared radiation (wavelength greater than $0.8\mu$) is functionally related to sheet resistivity and increases as sheet resistivity decreases. Thus, a minimum sheet resistivity is desired when the tin oxide film is a transparent electrode for a photovoltaic cell, while the corresponding high infrared reflectivity is desired to trap heat in solar heat collectors or to serve as window glass in energy-efficient homes.

The minimum sheet resistivity of the tin oxide film is obtained over a narrow temperature range, with extreme sensitivity below a minimum temperature of about 440° C. A maximum temperature is determined by the softening temperature of the particular glass. The ability to selectively resupply heat losses during the spray process, combined with the hereinabove described spray technique for permitting substrate temperature recovery between spray passes, provides the requisite temperature uniformity to yield the above tin oxide film. In some instances, the hardness of the tin oxide film is an additional important parameter, particularly in photovoltaic cell fabrication where selected portion of overlying materials are removed by scraping. The tin oxide film formed at temperatures above about 475° C. appears to have a preferred hardness for photovoltaic application.

The tin oxide film produced according to the above teachings is particularly suitable for solar energy conversion devices:

1. The low sheet resistivities of less than 10Ω sq. result in part from the non-stoichiometric nature of the film, i.e. $SnO_x$ is formed, where $X<2$. The low resistivities are necessary for efficient photovoltaic cells and the corresponding infrared reflectivity is necessary for solar energy heat collectors. Typically, sheet resistivities in the range of 5-10Ω/sq are obtained even with film thicknesses of 0.4-0.8 microns.

2. The film absorbs less than 10% of the incident visible light spectrum which yields efficient solar energy conversion to either heat or electricity.

3. The film has a low emissivity ($<0.1$) of infrared radiation (wavelength $>5$ microns) up to about 350° C., to further increase heat collection efficiencies.

4. A tightly adherent, hard film is produced which is highly scratch resistant, a desirable characteristic to withstand handling and to permit overlying materials to be removed without removing the $SnO_x$.

5. The film is chemically inert and remains stable under high temperatures and under exposure to ultraviolet irradiation.

6. A superior nucleating surface is provided for an overlying layer containing CdS, which surface is also substantially uniform and free of impurities which might affect CdS layer formation.

This combination of characteristics has not heretofore been available in a film of $SnO_x$.

If a photovoltaic cell is to be produced, at least one layer of a semiconductor material is now spray deposited over the tin oxide electrode layer. A variety of semiconductor materials, such as CdS, ZnS, CdZnS and other compounds formed from a solution containing a soluble compound of at least one of the elements from group VIA of the Periodic Table and a soluble compound of at least one element selected from the elements of groups IA, IIB, IIIA, IIIB, IVA, VA and VIII of the Periodic Table and suitable solutions are given in U.S. Pat. No. 3,148,084 to Hill et al.

A preferred semiconductor material is CdS. It may be desirable to provide a portion of the CdS layer with a material, such as aluminum, which acts to form a barrier to materials formed over the CdS and tending to diffuse through the CdS to the bottom electrode and short-circuit the cell. Additional CdS-forming compound is then sprayed until the desired thickness of 2-6μ is obtained. A suitable spray composition is the following:

First solution
   8 l. H$_2$O (deionized)
   18.63 gm CdCl$_2$.2½H$_2$O
   6.92 gm AlCl$_2$.6H$_2$O
   0.55 cc ZnCl$_2$ solution*
   6.33 gm Thiourea
Second solution
   4 l. H$_2$O(deionized)
   24.70 gm CdCl$_2$.2½H$_2$O
   5.0 cc ZnCl$_2$ solution*
   57 cc CH$_3$OH (methanol)
   8.40 gm Thiourea
*7 gm ZnCl$_2$ dissolved in 1 l. H$_2$O (deionized)

The above solution may be sprayed as hereinabove generally described for tin oxide except for the temperatures and spray rates. The reaction of the sprayed composition on the heated substrate produces the CdS layers, the first solution forming a generally amorphous structure and the second solution forming a defined polycrystalline structure. The size of the crystals is functionally related to the temperature of the substrate upon which the sprayed droplets impinge. A uniform quality film thus requires that a constant and uniform substrate temperature be maintained. Temperatures in the range of 250°-400° C. produce satisfactory CdS layer formations.

Thus, the glass substrate 20 is heated to a uniform preselected temperature within the above range. Substrate 20 may have to actually be slightly cooled in a continuous plant where the substrate is first coated with an electrically conducting material such as tin oxide. Substrate 20 is then carried into spray booth 16 beneath nozzle 40.

The CdS-forming solution is generally aqueous. Hence, the air flow heat load may be reduced since air flow must be maintained generally only to remove reaction waste products and not to dilute the evolved vapors. However, the water solution imposes a considerable heat loss. The solution must be sprayed at a slow rate to prevent glass damage. For example, a nozzle spray rate of 9 and 13 ml/min for the first and second solutions, respectively, with a spray head transverse velocity of about 24 in/sec and carriage speed of about 1.8–2.0 in/min, produces films of desired quality.

Some modifications may be made in the CdS spray section since the CdS layer is somewhat less sensitive to spray deposition control than the $SnO_x$ layer. Pre-spray baffle 56 might be eliminated and dwell tubes 59 might be replaced with simpler shield member, both changes being permitted by the reduced air flow and spray rate for the CdS-forming solutions. A plurality of spray nozzles 40 may be mounted on a common drive arm, spaced to control any overlap and to permit temperature recovery. A reduced tilt angle, $\theta = 10°$ to 15°, for nozzles 40 may be employed since some back flow onto heat zone 71 may be permitted.

It should be noted that CdS crystal growth appears to be enhanced by the presence of solution vapors. The reduced air flow permits the vaporized residue to remain above the sprayed solution. Further, post-spray baffle 58 may act to trap evolving vapors above the substrate to further enhance layer formation.

The slow rate of spray, combined with the required film thickness, requires that several spray stations be employed to form the total thickness. A heat treat zone 76 is not required after each spray heat zone 72 and post-spray zone 74 since the substrate temperature is generally maintained by heat zones 72 and 74. It may be desirable to include sequential spray zones where the spray rate is selected to permit recovery while the substrate remains within spray heat zone 72.

A final heat treat zone 76 may be provided after completing CdS layer deposition in order to affect crystal regrowth and obtain crystallites of increased size to enhance photovoltaic cell performance. A suitable treatment may be obtained by heating the coated substrate to a temperature of 400°–550° C. for about 5–60 minutes.

To complete the photovoltaic cell, a heterojunction is then formed with a suitable material, such as $Cu_2S$ and a conductive layer formed over the $Cu_2S$. The large panel may be configured to provide a plurality of cells and then be electrically interconnected to obtain a photovoltaic array having a determined voltage output.

The above processes may be performed using ordinary panels of window glass produced by conventional float glass techniques. It has also been found that some improvement in overall transmissivity of visible light is obtained where a low-iron content glass, which may be produced by ordinary roller-type fabrication is used. For example, a suitable low-iron glass substrate is marketed by Libbey-Owens-Ford under the trademark "Solar 90". It is believed, however, that any low-iron content glass would produce similar results.

It is therefore apparent that the present invention is one well adapted to obtain all of the objects and advantages hereinabove set forth, together with other advantages which will become obvious and inherent from the description of the process and apparatus themselves. It will be understood that certain combinations and subcombinations are of utility and may be obtained without reference to other features and subcombinations. This is contemplated by and is within the scope of the present invention.

What is claimed is:

1. A method of forming a photovoltaic cell, comprising:
    forming a spray composed substantially of a film-forming material,
    selecting a portion of said spray having preferred characteristics,
    selecting a portion of the surface of a glass substrate, and
    controlling deposition of said selected portion of said spray to substantially said selected portion of the surface of said substrate.

2. A method according to claim 1, including:
    forming said spray from a solution containing a cadmium salt and a sulfur-containing compound which react on said substrate in a heated zone to form a CdS-containing film.

3. A method according to claim 1, including:
    forming said spray from a solution containing a tin salt and a fluorine-containing compound which react on said substrate in a heated zone to form a transparent and electrically conductive tin oxide film.

4. A method according to claim 1, 2, or 3, wherein selecting a portion of said spray includes:
    moving the atmosphere about said spray and over said film forming surface in cooperative relationship with said spray to remove reacted portions of said film-forming material from above said film forming surface.

5. A method according to claim 4, wherein depositing said selected portion of said spray substantially on said selected portion of the surface of said substrate includes:
    projecting said spray at an acute angle toward said substrate.

6. A method according to claim 5, further including:
    selecting said acute angle to confine said selected portion of said spray to depositing on said selected portion of said surface within a single heat zone controlled to replace heat losses from said spray.

7. A method according to claim 6, wherein selecting a portion of said spray further includes:
    moving a nozzle projecting said spray at a uniform speed relative to said substrate; and
    reversing the direction of relative movement of said nozzle when said spray is substantially removed from above said film forming surface.

8. A method according to claim 7, further including:
    moving said substrate through a plurality of heated zones and projecting a plurality of sprays of said film-forming material to form a film having a preselected thickness.

9. A method according to claim 5, wherein depositing said spray on said selected portion of said substrate further includes:
    intercepting selected portions of said spray of said material from above said surface of said substrate.

10. A method according to claim 3, including:
    projecting said spray at an acute angle effective to confine said selected portion of said spray depositing on said surface to a portion of said surface in a downstream direction relative to said angle.

11. A method according to claim 10, wherein said acute angle is not less than 22°.

* * * * *